United States Patent [19]

Irwin

[11] Patent Number: 4,935,707

[45] Date of Patent: Jun. 19, 1990

[54] CURRENT REDUCTION OF A SYNTHESIZER

[75] Inventor: James S. Irwin, Bastrop, Tex.

[73] Assignee: Motorola, Inc., Schaumburg, Ill.

[21] Appl. No.: 346,446

[22] Filed: May 1, 1989

[51] Int. Cl.$^5$ .......................... H03L 7/08; H03L 7/18
[52] U.S. Cl. ...................................... 331/16; 331/1 A; 331/8; 331/17; 331/25
[58] Field of Search ....................... 331/1 A, 8, 15, 16, 331/17, 18, 25

[56] References Cited

U.S. PATENT DOCUMENTS

| | | | |
|---|---|---|---|
| 4,381,552 | 4/1983 | Nocilini et al. ...................... | 364/900 |
| 4,470,025 | 9/1984 | Baker ............................... | 331/1 A X |
| 4,649,353 | 3/1987 | Sonnenberg .......................... | 331/8 |
| 4,713,631 | 12/1987 | Enderby et al. ................... | 331/36 C |
| 4,764,737 | 8/1988 | Kaatz .................................. | 331/1 A |

*Primary Examiner*—David Mis
*Attorney, Agent, or Firm*—Daniel K. Nichols; Juliana Agon

[57] ABSTRACT

A synthesizer is provided to include a phase detector, a loop filter, a current source and two current sinks. The current source and the second current sink selectively supplies current to and from the loop filter, respectively. The first current sink selectively sinks current from the current source. Responsive to signals from the phase detector, a controller actuates the current source on prior to switching at least one of the first and second current sinks.

13 Claims, 3 Drawing Sheets

CURRENT REDUCTION OF A SYNTHESIZER

TECHNICAL FIELD

This invention relates generally to frequency synthesizers, and more particularly, to phase-locked loop synthesizers using charge pumps in their phase detectors.

BACKGROUND ART

Using a charge pump with a phase detector is well known in the art. On a discrete level, having the charge pump implemented by a PNP current source and an NPN current sink presents no problem. However, implementation of the PNP current source on an integrated circuit presents a new obstacle. Due to differences in IC processing, the PNP device reacts much slower than the NPN device. Therefore, the speed of the charge pump is limited by the slower PNP device. One solution to the speed problem is to keep the slower PNP device on all the time. In this way, the slowness of the switching speed of the PNP device will not limit the speed of the charge pump, whose speed may then be determined by the faster NPN devices. However, because the PNP device is always activated, the current drain of the charge pump is a significant loss. Hence, a need exists to implement a fast charge pump on an integrated circuit with a low current drain.

SUMMARY OF THE INVENTION

Accordingly, it is an object of the present invention to implement a fast charge pump on an integrated circuit with a low current drain.

Briefly, according to the invention, a synthesizer is provided to include a phase detector, a loop filter, a current source and two current sinks. The current source and the second current sink selectively supplies current to and from the loop filter, respectively. The first current sink selectively sinks current from the current source. Responsive to signals from the phase detector, a controller actuates the current source on prior to switching at least one of the first and second current sinks.

DETAILED DESCRIPTION OF THE PREFERRED EMBODIMENT

Figure 1:
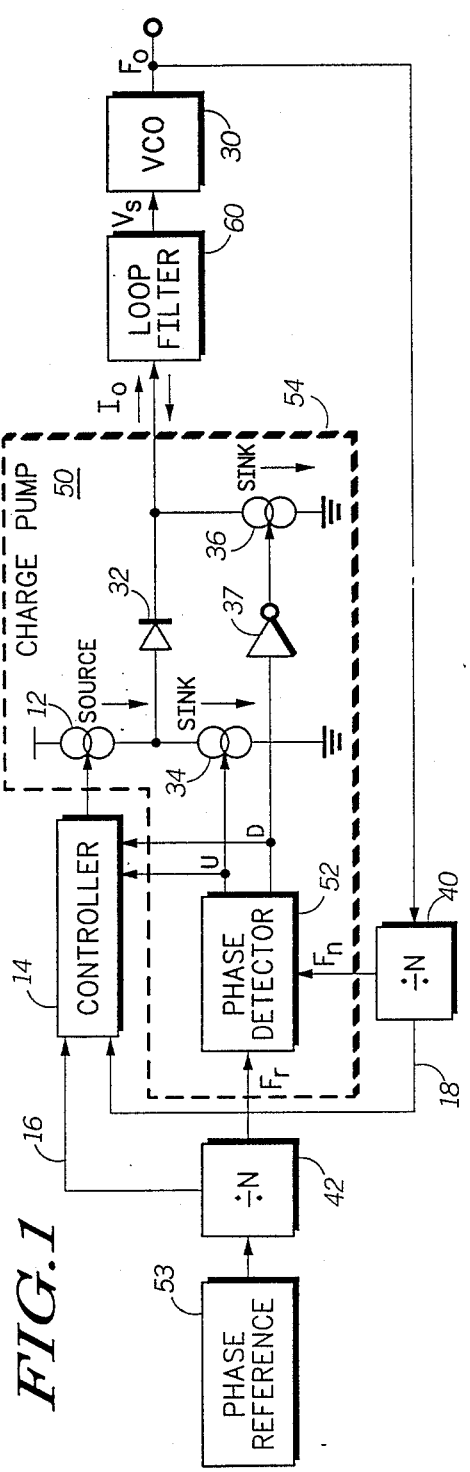
FIG. 1 is a preferred embodiment of a synthesizer in accordance with the present invention.

Referring to FIG. 1, frequency synthesizers commonly employ standard phase-locked loop circuitry wherein a Voltage Controlled Oscillator (VCO 30) output signal Fo is divided by a loop divisor N 40. To lock to a new frequency, the scaled synthesized frequency Fn is compared to a reference frequency signal Fr in a phase detector means 50. The reference frequency Fr can be provided by any suitable frequency generator, such as an oscillator or phase reference 53.

The phase detector means 50 generates up and down signals indicative of the phase relationship between the reference frequency Fr and the scaled, synthesized frequency Fn.

The output of the loop divisor Fn is compared to a reference frequency signal Fr (after division by an optional reference divider 42) in a phase detector 52. In the preferred embodiment, the phase detector means 50 may be a Motorola part MC14046 tri-state phase detector 52 with a charge pump 54.

The charge pump 54 generates a charging current Io whose duration is proportional to the phase difference detected. The charge pump 54 generates a charging or discharging current Io and supplies it to the capacitive elements at a loop filter 60 in response to up and down pulses received from the phase detector 52. The charging current Io is utilized to charge capacitive elements in the loop filter 60, thereby developing a steering line control voltage Vs for the Voltage Controlled Oscillator (VCO 30). The result is that the phase-locked loop operates to acquire, and then maintain, the Voltage Controlled Oscillator (VCO 30) frequency as an integral multiple (N) of a reference frequency Fr. Thus, a synthesized frequency Fo is generated by the Voltage Controlled Oscillator (VCO 30) and is proportional to the control voltage on its VCO input Vs.

The charge pump 54 is switched by the phase detector 52 on output lines U and D. A current source 12 is provided for charging the capacitive elements of the loop filter 60 and thereby generates a steering line voltage control signal Vs for the Voltage Controlled Oscillator (VCO 30) when the synthesized frequency Fo must be brought up from its current frequency. Similarly, a current sink 36 is provided to discharge the capacitive elements of the loop filter 60 to reduce the steering line voltage control signal Vs, when the synthesized frequency Fo must be brought down from its current value.

The charge pump 54 can be symbolically represented as a current source 12 in series with a first current sink 34 connected at their junction to a second current sink 36 via a diode 32. In contrast to the turn-on operation of the current source 12, both current sinks 34 and 36 turn on when a high signal is present and off for a low. The first current sink 34 is always on unless current sourcing is desired to increase the frequency of the VCO 30. On the other hand, the second current sink 36 is always off unless current sinking is desired to decrease the VCO frequency. To provide the necessary control signal, an inverter 37 is coupled to the input of the second current sink 36.

The current source 12 is activated only when the charge pump 54 is needed to generate the output signal (Io). As illustrated by the preferred embodiment, a controller 14 turns the current source 12 on and off in response to the dividers 42 and 40 via lines 16 and 18, respectively. When programming the dividers 42 and 40 by a number less than the current value of N, the divider lines 16 and 18 provide a signal via the controller 14 to anticipatively activate the current source 12 prior to the reference frequency Fr and the synthesized frequency Fn being received by the phase detector 52. The controller 14 can maintain the active status of the current source 12 for a predetermined time so that the current source 12 will be on long enough to generate the required output signal (Io). Since the current source 12 is a relatively slower PNP device, its inherent switching speed may be used in determining the time needed to keep the charge pump 54 actuated.

Alternately, once the current source 12 is turned on, the controller 14 can maintain this on status until the end of the signals from the longer pulse on line U or D has been detected from lines U and D.

Figure 2:
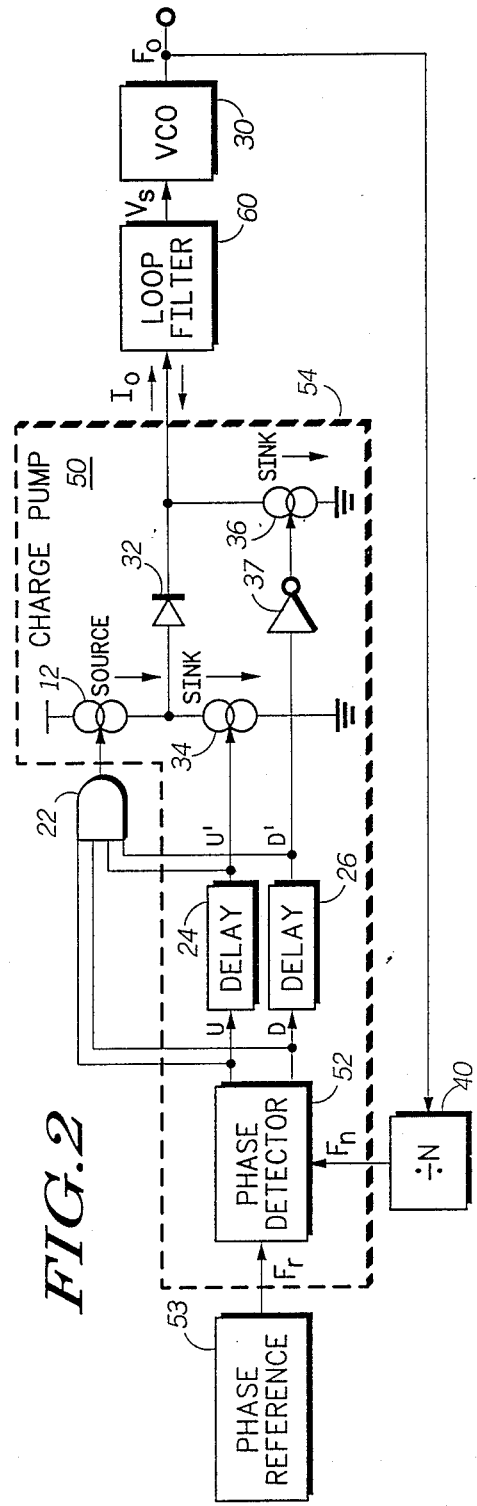
FIG. 2 is an alternate embodiment of the synthesizer in accordance with the present invention.

Referring to FIG. 2, an alternate embodiment for the activation of the current source 12 is illustrated. As one variation, an AND gate 22 is provided to turn on the current source 12 before the charge pump output signal ($I_o$) is generated. For this PNP current source 12, the ON condition corresponds to a low input signal (0 V) and the OFF condition corresponds to a high input signal (5 V). Therefore, the current source 12 is turned on when a low or an inverted logic signal (ON corresponds to a low or 0 voltage) from the phase detector 52 is present on either of lines U or D. Meanwhile the phase detector up and down output pulses needed for output signal generation by the charge pump 54 are delayed by delay circuits 24 and 26. The AND gate 22 keeps the current source 12 on until the delayed low signals on lines U' and D' are no longer present. (Realistically, because of the inherent delay of the slower PNP current source 12 the charge pump 54 will still be on after the charge pump output signal $I_o$ is generated to ensure proper operation).

Once the current source 12 is actuated by an appropriate method, the operation of the charge pump 54 in FIGS. 1 and 2 is the same. For clarification, the operation of the charge pump 54 will only be discussed with reference to FIG. 2.

Figure 3A:
FIGS. 3a-e are timing diagrams illustrating the inputs to the charge pump during tri-state operation.
Figure 3B:

Referring to FIGS. 3a-e, a steady state signal is produced when the synthesized frequency Fn is at its desired value and no phase difference exists. In this tri-state mode, both output up and down signals on lines U and D are off (5 V) after the minimum pulse width interval as illustrated in FIGS. 3a-b. Preferably, the maximum delay is set for a time interval less than the minimum pulse width inherently generated by the phase detector 52.

Figure 3C:
Figure 3D:
Figure 3E:

The output of the AND gate 22 of FIG. 2 is illustrated in FIG. 3e. Prior to generating the output signal $I_o$, the current source 12 needs to be turned on. Because the delayed and non-delayed signals are not at a high voltage at the same time as illustrated in FIGS. 3a-d, the output of the AND gate 22 will be at a low voltage for the duration of the delayed and non-delayed signals as illustrated in FIG. 3e. This low signal from the output (0 V) of AND gate 22 actuates the current source 12. As illustrated by the delay as illustrated by FIGS. 3c-e, the current source 12 will therefore be actuated before either of the current sinks 34 and 36 are switched by the delayed pulses on U' and D'.

After a delay and inversion (37) of the OFF signal (5 V) on line D' as illustrated in FIG. 3d, the second current sink 36 is deactivated. On the other hand, the current sink 34 is activated after the same delay by the OFF signal (5 V) on the U' line of FIG. 3c. Since the current sink 34 has the capacity to sink all of the current that the current source 12 can source, none of the sourced current will flow through the diode 32 to the loop filter 60. In addition, the current from the steering control line Vs is prevented from flowing back into the current sink 34 by the diode 32.

When the voltage controlled oscillator (VCO 30) is changed in frequency, the phase detector 52 furnishes appropriate phase indicative signals on line U and/or D causing the charge pump 54 to supply current to or sink current from the steering control line Vs via the loop filter 60.

Figure 4A:
FIGS. 4a-e are timing diagrams illustrating the inputs to the charge pump when frequency needs to be increased.
Figure 4B:
Figure 4C:
Figure 4D:
Figure 4E:

Referring to FIGS. 4a-e, when the frequency of the VCO 30 needs to be increased, the phase detector 52 generates an ON signal on line U. This ON (0 V) signal and a corresponding OFF (5 V) signal on line D are illustrated in FIGS. 4a and 4b, respectively. Because both of the signals on lines U and D are not at a high voltage, the output of the AND gate 22 will be at a low voltage for the duration of the delayed and undelayed signals as illustrated in FIG. 4e. As illustrated by the delay in FIGS. 4c-e, the current source 12 will be activated before the delayed pulses are applied to the current sinks 34 and 36. By the application of the low signal from the output (0 V) of AND gate 22, the current source 12 is activated. The delayed signal present (ON=0 V) on line U' as illustrated in FIG. 4c deactivates the first current sink 34. After inversion (37), the delayed signal pulse (5 V) on line D' of FIG. 4d, activates the second current sink 36. As the U' pulse is longer, the activated current source 12 applies current to the steering control line Vs via the diode 32 to increase the frequency of the VCO 30.

Figure 5A:
FIGS. 5a-e are timing diagrams illustrating the inputs to the charge pump when frequency needs to be decreased.
Figure 5B:
Figure 5C:
Figure 5D:
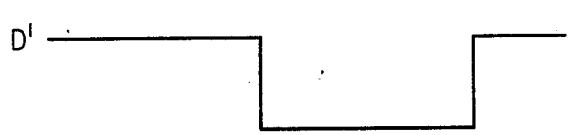
Figure 5E:

Referring to FIGS. 5a-e, when the frequency of the VCO 30 needs to be decreased, the phase detector 52 generates an ON signal on line D. This ON (0 V) signal and a corresponding OFF (5 V) signal on line U are illustrated in FIGS. 5a and 5b, respectively. Because both the signals on lines U and D are not at a high voltage, the output of the AND gate 22 wil be at a low voltage for the duration of the delayed and undelayed signals as illustrated in FIG. 5e. As illustrated by the delay in FIGS. 5c-e, the current source 12 will be activated before the delayed pulses are applied to either of the current sinks 34 and 36. By the application of the low signal from the output (0 V) of AND gate 22, the current source 12 is activated. After the delay, the first current sink 34 is activated by the OFF (5 V) signal of FIG. 5c. Once activated, the current sink 34 sinks all of the current from the current source 12. After the delay and inversion (37) of the ON (0 V) signal of FIG. 5d, the second current sink 36 is also activated. As the U' pulse has a shorter duration than the D' pulse, the first current sink 34 will turn back on, thereby permitting the second current sink 36 to sink current from the loop filter 50 to decrease the frequency of the VCO 30.

What is claimed is:

1. A synthesizer including a phase detector and a loop filter, comprising:
    a current source for selectively supplying current to the loop filter;
    a first current sink for selectively sinking current from said current source;
    a second current sink for selectively sinking current from the loop filter; and
    control means, responsive to signals from the phase detector, said control means actuating said current source on prior to switching at least one of said first and second current sinks.

2. The synthesizer of claim 1 wherein said current source comprises bias means selectively controlled by said control means.

3. The synthesizer of claim 1 wherein said current source comprises an integrated PNP transistor.

4. The synthesizer of claim 1 wherein said control means comprises a controller.

5. The synthesizer of claim 1 wherein said control means comprises delaying means.

6. The synthesizer of claim 1 wherein said control means actuates said current source on prior to actuating said first current sink off.

7. The synthesizer of claim 1 wherein said control means actuates said current source on prior to actuating said second current sink on.

8. The synthesizer of claim 4 wherein said means for controlling comprises a switchable current source.

9. A synthesizer including a phase detector for providing an output signal, comprising:
   means for generating an output signal;
   means for receiving and delaying said input signal;
   means for generating an output signal in response to said delayed input signal; and
   means for controlling said output signal generating means to be active when any of said input signals is received and inactive at the absence of said delayed input signal.

10. A synthesizer including a phase detector and a charge pump for providing an output signal, comprising:
    means for receiving a first and a second input signal;
    delaying meas for providing a first and a second delayed input signal;
    means for generating an output signal in response to said first and second delayed input signals; and
    means for controlling said charge pump to be active when either a first or a second input signal is received and inactive at the absence of said first and second delayed input signals.

11. The synthesizer of claim 10 wherein said charge pump comprises:
    a current source having its bias controlled by said controlling means;
    a first current sink coupled to said current source, said first current sink having an input responsive to said first delayed input signal; and
    a second current sink coupled to said current source and said first current sink via a diode, said second current sink having an input responsive to said second delayed input signal.

12. The charge pump of claim 11 further comprising an inverter coupled to said second current sink.

13. The charge pump of claim 10 wherein said delaying means provides a delay less than a minimum pulse width of said charge pump.

* * * * *

UNITED STATES PATENT AND TRADEMARK OFFICE
CERTIFICATE OF CORRECTION

PATENT NO. : 4,935,707
DATED : June 19, 1990
INVENTOR(S) : Irwin

It is certified that error appears in the above-identified patent and that said Letters Patent is hereby corrected as shown below:

Claim 9, line 13, of column 5, cancel "output," and insert --input--.

Signed and Sealed this

Seventh Day of April, 1992

*Attest:*

HARRY F. MANBECK, JR.

*Attesting Officer*      *Commissioner of Patents and Trademarks*